United States Patent [19]
DeFilippi

[11] 4,016,434
[45] Apr. 5, 1977

[54] LOAD GATE COMPENSATOR CIRCUIT

[75] Inventor: Robert Joseph DeFilippi, Reston, Va.

[73] Assignee: International Business Machines Corporation, Armonk, N.Y.

[22] Filed: Sept. 4, 1975

[21] Appl. No.: 610,202

[52] U.S. Cl. .............................. 307/297; 307/205; 307/214; 307/304

[51] Int. Cl.² .................... H03K 1/02; H03K 1/10; H03K 19/08; H03K 19/40

[58] Field of Search .......... 307/205, 214, 297, 304; 330/35

[56] References Cited
UNITED STATES PATENTS

| | | | |
|---|---|---|---|
| 3,609,414 | 9/1971 | Pleshko et al. | 307/304 X |
| 3,702,943 | 11/1972 | Heyner et al. | 307/304 X |
| 3,789,246 | 1/1974 | Preisig et al. | 307/304 |
| 3,823,332 | 7/1974 | Feryszka et al. | 307/297 |
| 3,875,430 | 4/1975 | Prak | 307/297 |
| 3,913,026 | 10/1975 | Koehler | 330/35 |
| 3,970,875 | 7/1976 | Leehan | 307/304 |

OTHER PUBLICATIONS

Pleshko et al, "MOS Transistor Electronic Stabilization of Thresholds"; *IBM Tech. Discl. Bull.*; vol. 10, No. 3, p. 336, 8/1967.

Frantz; "Threshold Voltage Control for N-Channel MOSFET Devices"; *IBM Tech. Discl. Bull.*; vol. 12, No. 12, p. 2078; 5/1970.

Baitinger et al.; "Constant-Current Source Network"; *IBM Tech. Discl. Bull.*; vol. 13, No. 9, p. 2516, 2/1971.

*Primary Examiner*—John S. Heyman
*Assistant Examiner*—Larry N. Anagnos
*Attorney, Agent, or Firm*—John E. Hoel

[57] ABSTRACT

An FET load gate compensator circuit is disclosed which compensates for variations in the parameters characterizing the silicon substrate in FET large scale integrated circuit device, by generating a compensatory load gate voltage to be applied to the load gates of the functional circuits therein.

6 Claims, 6 Drawing Figures

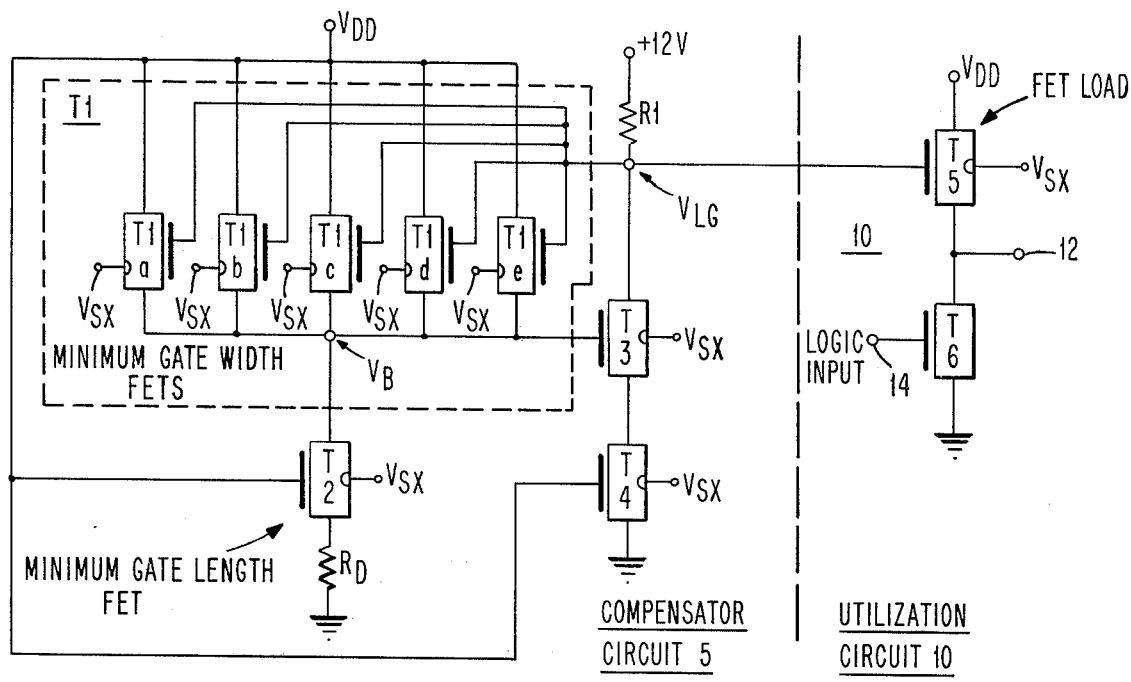
FIG. 1
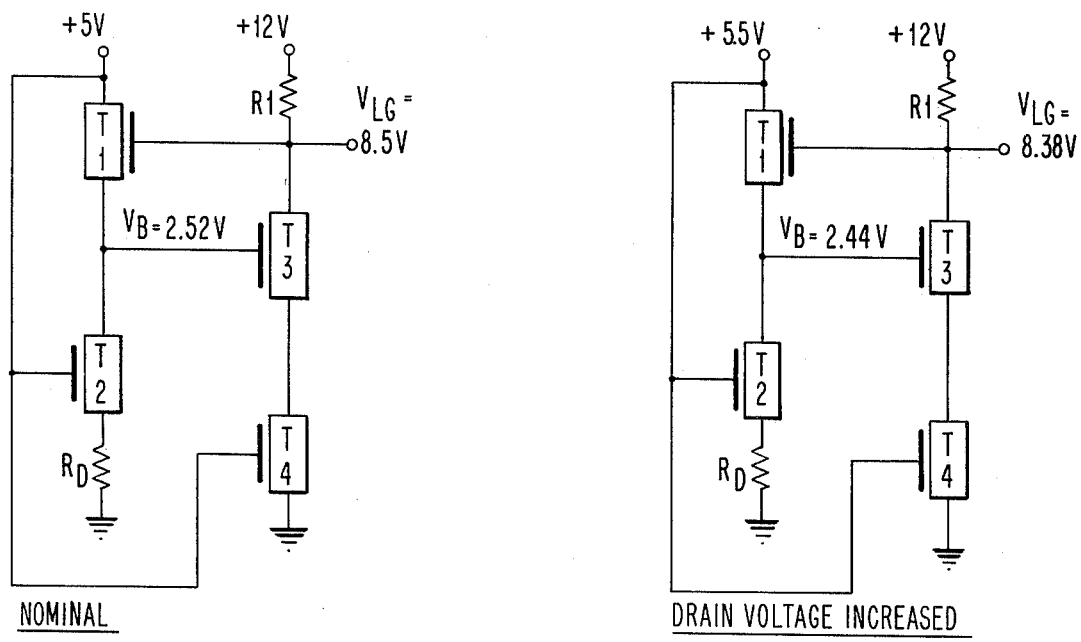
FIG. 2a — NOMINAL
FIG. 2b — DRAIN VOLTAGE INCREASED

LOAD GATE COMPENSATOR CIRCUIT

FIELD OF THE INVENTION

The invention relates generally to control and stabilization techniques which utilize negative feedback to set the operating point of transistor devices. More specifically, it relates to the adjustment in stabilization of the performance of FET linear load circuitry by controlling the load gate potential for load devices in a plurality of FET circuits on a semiconductor chip.

BACKGROUND OF THE INVENTION

When designing large scale FET circuitry, the nominal load device dimensions for each circuit are selected such that a pre-defined maximum allowable power dissipation will not be exceeded despite variations in process parameters such as threshold voltage, transconductance, or topological variation. The minimum active device dimensions are selected such that the circuit exhibits acceptable voltage gain and noise immunity despite worse case of variations in these process parameters. Larger variations in these process parameters require the designer to specify larger active devices which in turn present increased loading to the circuits that drive them, thereby slowing delay propagation in the circuit. The circuit's worse case performance will be slower than the designed for, nominal performance by an amount that increases with the tolerance in the process and environmental parameters for the LSI chip.

Attempts have been made in the prior art to compensate for variations in process parameters on an LSI chip, an example of which is the Pleshko, et. al. U.S. Pat. No. 3,609,414, filed Aug. 20, 1968 and assigned to the instant assignee. Pleshko discloses an on-chip circuit for compensating for variations in the process parameters by compensating for the resulting threshold voltage variation in FET devices embodied in the chip, by controlling the substrate voltage of the chip. Although the Pleshko, et. al. invention works well for its particular application, it has the disadvantage of imposing the compensation voltage on every circuit on the chip, thereby precluding the selective compensation of multiple threshold circuits, such as enhance/deplete FET circuitry. An additional problem with the Pleshko, et. al. compensation technique is, that in an N-channel device compensated by substrate voltage control, high threshold voltages will be compensated by low substrate bias voltages. Low substrate bias voltages increase the junction capacitance which further degrades performance of the circuits. Also, low substrate bias voltages may increase the probability of undesirable parasitic FET action formed by surface inversion and low substrate bias.

OBJECTS OF THE INVENTION

It is an object of the invention to compensate for the effects of variations in process parameters on the performance characteristics of an LSI chip, in an improved manner.

Another object of the invention is to compensate for variations in threshold voltages of FET devices on an LSI chip, in an improved manner.

Still another object of the invention is to compensate for variations in the transconductance of FET devices on an LSI chip, in an improved manner.

Still a further object of the invention is to compensate for variations in the gate width of FET devices on an LSI chip, in an improved manner.

A further object of the invention is to compensate for variations in the active gate length of FET devices on an LSI chip, in an improved manner.

Still a further object of the invention is to compensate for variations in the diffusion resistance of FET devices on an LSI chip, in an improved manner.

Still another object of the invention is to compensate for variations in the drain voltage supply to FET devices in an LSI chip, in an improved manner.

Yet another object of the invention is to compensate for variations in the load gate length in FET circuits on an LSI chip, in an improved manner.

SUMMARY OF THE INVENTION

An FET gate compensator circuit is disclosed which compensates for variations in the parameters characterizing the silicon substrate of an LSI FET device, by generating a compensatory load gate voltage to be applied to the FET load gates of the functional circuits on an LSI FET chip. The circuit consists of a first enhancement mode FET transistor in the substrate, having its drain connected to a drain potential, its source connected to a first node, and its gate connected to an output node. The first transistor comprises a plurality of component FET devices connected in parallel, each component device having a gate of minimum width. A second enhancement mode FET device in the substrate has its drain connected to the first node, its source connected through a diffused resistor to ground, and its gate connected to said drain potential. The second FET transistor has a gate region with a minimum length. A third enhancement mode FET transistor has its drain connected to the output node, and its gate connected to the first node. The third transistor operates as an inverting amplifier between the first node and the output node. A fourth enhancement node FET transistor has its drain connected to the source of the third transistor, its source connected to ground, and its gate connected to the drain potential. A precision resistor is connected between the output node and a relatively high potential. The circuit operates to generate a load gate voltage at the output node which has a magnitude responsive to variations in the electrical properties of the substrate. This load gate voltage is applied as a compensatory voltage, to the gates of FET devices serving as the loads in selected FET circuits on the semiconductor chip.

DESCRIPTION OF THE DRAWINGS

The foregoing and other objects, features and advantages of the invention will be apparent from the following more particular description of the preferred embodiments of the invention, as illustrated in the accompanying drawings.

FIG. 1 is a schematic diagram of the compensating sense circuit.

FIG. 2a illustrates the operation of the circuit of FIG. 1 for nominal values of the process parameters.

FIG. 2b illustrates the operation of the circuit of FIG. 1 to compensate for an increased drain voltage above its nominal value.

DISCUSSION OF THE PREFERRED EMBODIMENT

Figure 2C:
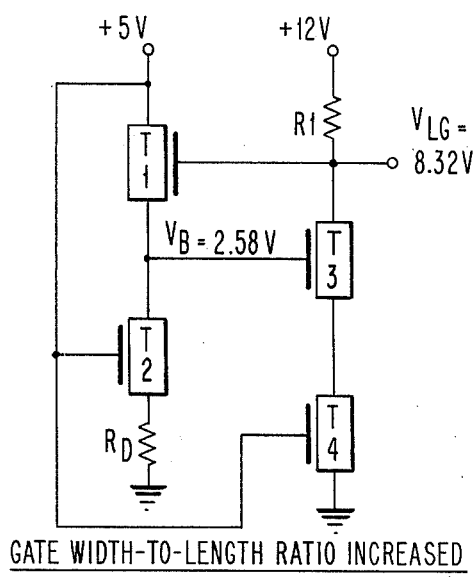
FIG. 2c illustrates the operation of the circuit of FIG. 1 to compensate for an increased gate width-to-length ratio above its nominal value.

The present compensating circuit invention seeks to compensate for parametric variations by means of regulating the load gate voltage of FET functional circuits on the LSI chip. The primary effect of an increase in the FET load gate voltage ($V_{LG}$), is an increase in FET load device current. The circuit disclosed herein operates to compensate for variations in process parameters which increase load device current, by generating a correspondingly reduced load gate voltage, and vice versa.

The load gate compensator circuit is shown in schematic form in FIG. 1. The circuit consists of a first enhancement mode FET transistor T1 having its drain connected to a drain supply voltage $V_{DD}$, its source connected to a first node, and its gate connected to the load gate voltage output node $V_{LG}$.

A second enhancement mode field effect transistor T2 has its drain connected to the source of T1, its source connected to a diffused resistor which is in turn connected to ground, and its gate connected to the drain potential $V_{DD}$. Transistor T1 consists of five parallel FET devices each of which has a minimum width gate, permitting the sensing of process induced variations in the width of the gates of the functional circuits on the chip. Transistor T2 has a minimum length gate enabling the sensing of process induced changes in the length of the gates of the functional devices on the chip.

A third FET enhancement mode transistor T3 has its drain connected to a $V_{LG}$ node and its gate connected to the first node between T1 and T2.

T3 operates as an inverting amplifier. FET enhancement mode transistor T4 has its drain connected to the source of T3, the source connected ground, and its gate connected to the drain potential $V_{DD}$. The $V_{LG}$ node is connected through an off-chip precision resistor R1, to a +12 volt potential.

The simplified connection of the gate of transistor T4 to $V_{DD}$ permits the use of a single device T3 as the inverting amplifier, thereby permitting a more simplified load gate compensator circuit than was available in the prior art.

The width-to-length ratio of the gate of T1 has a value of approximately 3 and the width-to-length ratio of the gate of T2 has a value of approximately 7.

The width-to-length ratio of the gate of T3 has a value of approximately 100 and the width-to-length ratio of the gate of T4 has a value of approximately 5.

The precision resistor R1 has an impedance of approximately 10,000 ohms with a tolerance of approximately ± 1%. The precision resistor R1 is located outside of the semiconductor chip. All other elements of the compensator circuit are contained on the same semiconductor chip as the LSI circuitry to be compensated.

FIG. 1 also shows an example of a functional circuit 10 having an enchancement mode FET load transistor T5 with its drain connected to $V_{DD}$, its gate connected to the $V_{LG}$ voltage supplied from the compensating circuit 5, and its source connected to a functional circuit output node 12. The functional circuit 10 also contains an active FET enhancement mode device T6, having its drain connected to the functional circuit output node 12, its gate connected a logic signal input, and its source connected to ground. Variations in the process parameters of the LSI device which increase the current going through the load device T5, will be compensated for by the compensator circuit 5, by a reduction in magnitude of the load gate voltage $V_{LG}$ supplied to the gate of T5.

In the load gate compensator circuit of FIG. 1, one particular combination of device sizes would be as follows. The gate of T1 would have a width-to-length ratio of 3.04. The gate of T2 would have a width to length ratio of 7.10. The gate of T3 would have a width-to-length ratio of 100. The gate of T4 would have a width-to-length ratio of 5.24. The resistor $R_D$ would be an on-chip diffused resistor having a resistance of 1.33 kilohms ±25%. The resistor R1 would be an off-chip discrete resistor having a resistance of 10 kilohms ±1%. The load gate compensator circuit is on the same substrate as the functional FET circuit being regulated.

OPERATION

The primary effect of an increase in the load gate voltage ($V_{LG}$) is an increase in the load device current. The function of the load gate compensator circuit of FIG. 1, is to produce output voltage variations which are equal to the $V_{LG}$ correction required to compensate for variations in the device parameters, as shown in Table 1. Operation of the compensator circuit for nominal values of the device parameters is shown in FIG. 2a.

TABLE 1

| | Change in $V_{LG}$ to: | | | |
| Parameter | To Optimize DC Design Ratio | To Minimize Delay Variation | To Minimize Power Dissipation Variation | Generated $V_{LG}$ Change |
| --- | --- | --- | --- | --- |
| Threshold Vt | + | + | + | + |
| Transconductance | − | − | − | − |
| Load Width | − | − | − | − |
| Active Length | − | − | Insensitive | − |
| Diff. Resistance | − | Insensitive | Insensitive | − |
| Drain Voltage | Slightly + | Insensitive | − | − |
| Load Length | Insensitive | Insensitive | Insensitive | Insensitive |
| Active Width | Insensitive | Insensitive | Insensitive | Insensitive |

1. Diffusion Resistance Variation

Increased parasitic diffusion in the sources and drains of active devices like T6 causes down levels to rise unless it is properly compensated by decreasing DC current flow in the circuit (reducing $V_{LG}$). Reduced resistances are sometimes indicative of oversized diffusions and increased capacitance as discussed in conjunction with active device length variations below. Consequently reduced resistance is properly compensated with increased $V_{LG}$.

The function of the sense circuit in FIG. 1 is to produce output voltage variations which are equal to the $V_{LG}$ correction required to compensate, as shown in Table 1 and described for the above parametric aberation. It does so in the following manner. As the diffusion resistance on the chip decreases, the value of $R_D$ will also decrease. This lowers the voltage drop across $R_D$ and thereby the voltage at the source of $T_2$. This will also lower the voltage at the source of T1, which is the voltage at the gate of T3. T3 will therefore not conduct as hard, raising $V_{LG}$.

2. Drain Voltage Supply Variation

In a linear load design, drain voltage variations have little influence on DC levels or AC performance. Power dissipation, however is directly proportional to drain voltage. Therefore, it is desirable to compensate for increasing drain voltage by decreasing load gate voltage, and consequently load device current and circuit power.

The function of the sense circuit in FIG. 1 is to produce output voltage variations which are equal to the $V_{LG}$ correction required to compensate, as shown in Table 1 and described for the above parametric aberation. It does so in the following manner. As the Drain Voltage (+5V) increases, the gates of T2 and T4 are turned on harder as shown in FIG. 2b. This causes more current to flow through T1 and T2 and through T3 and T4, thereby lowering $V_{LG}$.

3. Gate Size Variations a. Load Gate Length, Active Device Width

Since the nominal values of load gate length and active device width are typically much larger than their associated variations, it is not necessary to compensate for such variations. Designs wherein nominal values of these parameters are magnitudes not larger than their variations, can be converted into designs having this typical property by replacing each short load device with a long load device having two or more minimum width channels in parallel to achieve a composite device having the same effective width-to-length ratio. Similarly, narrow active devices can be converted into a series strings of minimum length, non-minimum width devices.

b. Active Device Length Variation

Active or input devices T6 are usually designed with minimum channel lengths and are thus more vulnerable to channel variations. Long channel lengths are indicative of lower circuit currents and slower delay performance, since less current is available to charge up parasitic capacitances. Consequently, it is desirable to increase the circuit current by raising $V_{LG}$, for proper compensation.

Short channels cause increased circuit currents. Large currents in turn, imply excessive circuit power dissipation. Short channels with the increased power dissipation, are properly compensated by decreasing the charging current obtained by decreasing the load gate voltage.

The function of the sense circuit in FIG. 1 is to produce output voltage variations which are equal to the $V_{LG}$ correction required to compensate, as shown in Table 1 and described for the above parametric aberation. It does so in the following manner. As L decreases, the W/L ratios tend to increase the current in T1 and T2, and the voltage at the sources of T1 and T2 increase due to the increased drop across $R_D$. This tends to cause more current to flow in T3 and T4, thereby decreasing $V_{LG}$, as shown in FIG. 2c.

c. Gate Width Variation

Mask, exposure, and etch variations cause device width variations. These variations are far more important in FET load T5 than in active device gate of T6 because of the load's smaller nominal width dimension. Increased load gate widths cause increased power and higher down levels and so are compensated by lower load gate voltages. Small load gate widths decrease charging current and should be compensated by increased gate voltage to maintain constant performance.

The function of the sense circuit in FIG. 1 is to produce output voltage variations which are equal to the $V_{LG}$ correction required to compensate, as shown in Table 1 and described for the above parametric aberation. It does so in the following manner. As W increases, the W/L ratios tend to increase the current in T1 and T2, and the voltage at the sources of T1 and T2 increase due to the increased drop across $R_D$. This tends to cause more current to flow in T3 and T4, thereby dropping $V_{LG}$, as shown in FIG. 2c.

4. Transconductance Variation

An increase in transconductance causes increase current flow in a linear load circuit 10. This results in increased power dissipation and increased down levels (because of increased current flow in parasitic source resistances). The solution to both the dissipation and the DC design (level) problem is to compensate for increased transconductance with decreased load gate voltage. A decrease in transconductance causes less current to be available to charge capacitors at node 12. This can be compensated by an increase in load gate voltage.

Figure 2D:
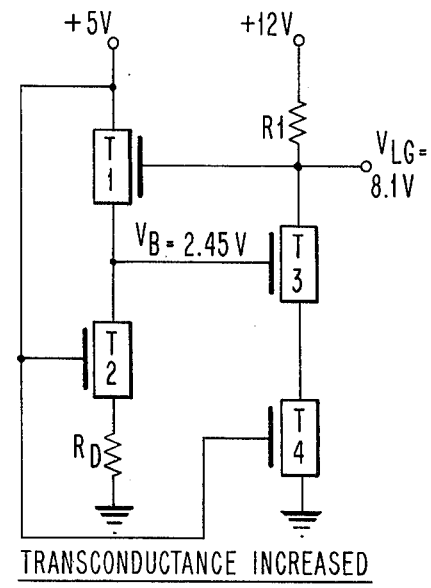
FIG. 2d illustrates the operation of the circuit for FIG. 1 to compensate for an increase in the transconductance above its nominal value.

The function of the sense circuit in FIG. 1 is to produce output voltage variations which are equal to the $V_{LG}$ correction required to compensate, as shown in Table 1 and described for the above parametric aberation. It does so in the following manner. As the transconductance increases, the currents increase in all four transistors T1 through T4. The increased current through the 10K load resistor R1 will lower $V_{LG}$, as shown in FIG. 2d.

5. Threshold Voltage Variation

If threshold voltages are low, circuit active devices T6 will be more sensitive to high down levels in the circuit outputs driving them, also the down levels themselves will tend to be high because the low $V_T$'s cause increased current flow and hence voltage drops in drain diffusions. Consequently, it is desirable to decrease load device current by decreasing $V_{LG}$ when thresholds are low to preserve good DC noise immunity. Since low $V_T$'s cause higher currents, it is desirable to compensate for low $V_T$'s with lower $V_{LG}$'s to maintain nearly constant currents and minimize power dissipation variation. Since high $V_T$'s make less current available for charging capacitors at node 12, it is desirable to compensate high $V_T$'s with high $V_{LG}$ to minimize variation in capacitor charging current and therefore in delay. High thresholds are sometimes indicative of high substrate doping and consequently high diffusion capacitance. Therefore, it is desirable to compensate for this higher capacitance with higher $V_{LG}$.

Figure 2E:
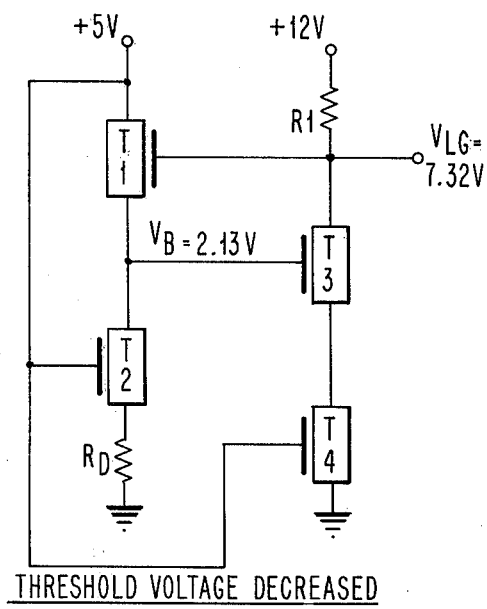
FIG. 2e illustrates the operation of the circuit of FIG. 1 to compensate for a decrease in the threshold voltage below its nominal value.

The function of the sense circuit in FIG. 1 is to produce output voltage variations which are equal to the $V_{LG}$ correction required to compensate, as shown in Table 1 and described for the above parametric aberation. It does so in the following manner. As $V_T$ decreases, the current increases in all four transistors T1 through T4. This increased current through T3 and T4 goes through the 10K load resistor R1, dropping $V_{LG}$, as shown in FIG. 2e.

It is obvious that different circuit designs will have different sensitivities (correlation coefficients) to each specific type of parameter variation. For example, circuits using ion implanted depletion mode load devices for T5 are sensitive to the characteristics of the implant, but they may be less sensitive to load gate width variation than enhancement load circuits. Consequently, two compensation networks 5 could be constructed to support both enhancement and depletion load circuits 10 on the same chip. This is an advantage over the prior art compensators which utilized substrate potential as a control parameter and were therefore limited to one compensation circuit per substrate (chip).

To summarize, the compensation circuit invention disclosed herein compensates for most of the troublesome parametric variations incurred during the course of the fabrication of an LSI chip. Use of this compensation circuit permits the design of large scale integrated circuit FET devices having a nominal circuit power closer to worst case allowable, employing smaller active devices T6, and having signal propagation delays closer to the intended nominal value. The compensation circuit invention is DC stable and requires no chip connections other than the customary load, drain, and ground supply leads in its enhancement load embodiment. It requires one external resistor R1. It does not cause substrate voltage variation as do many $V_{SX}$ compensators known in the prior art and, therefore, it does not lead to problems of unwanted inversion, leakage, or diffusion capacitance variation.

While the invention has been particularly shown and described with reference to the preferred embodiments thereof, it will be understood by those skilled in the art that foregoing and other changes in form and the details may be made therein without departing from the spirit and the scope of the invention.

I claim:

1. In an integrated circuit on a semiconductor substrate, a load gate compensator circuit comprising:
   a first enhancement mode FET transistor in said substrate having its drain connected to a drain potential, its source connected to a first node, and its gate connected to an output node, said first transistor comprising a plurality of component FET devices connected in parallel, each said component device having a gate of minimum width;
   a second enhancement mode FET device in said substrate having its drain connected to said first node, its source connected through a diffused resistor to ground, and its gate connected to said drain potential;
   said second FET transistor having a gate region with a minimum length;
   a third enhancement mode FET transistor having its drain connected to said output node, and its gate connected to said first node;
   said third transistor operating as an inverting amplifier between said first node, and said output node, requiring no reference potential;
   a fourth enchancement mode FET transistor having its drain connected to the source of said third transistor, its source connected to ground, and its gate connected to said drain potential;
   a precision resistor connected between said output node and a relatively high potential;
   whereby a load gate voltage is generated at said output node of said circuit having a magnitude responsive to variations in the processing parameters of said integrated circuit.

2. The circuit of claim 1, wherein the width-to-length ratio of the gate of said first transistor is approximately three, and the width-to-length ratio of the gate region of said second transistor is approximately seven.

3. The circuit of claim 2, wherein the width-to-length ratio of the gate region of said third transistor is approximately 100 and the width-to-length ratio of the gate region of said fourth transistor is approximately five.

4. The circuit of claim 3, wherein said precision resistor has an impedance of approximately 10,000 ohms with a tolerance of plus or minus approximately 1%.

5. The circuit of claim 4, wherein said precision resistor is located outside of said semiconductor substrate.

6. The circuit of claim 1, wherein said first transistor is comprised of five component FET devices, each of which has a gate region with a minimum width.

* * * * *